(12) United States Patent
Kuhara et al.

(10) Patent No.: US 7,315,698 B2
(45) Date of Patent: Jan. 1, 2008

(54) OPTICAL MODULE AND AN OPTICAL RECEIVER USING THE SAME

(75) Inventors: Yoshiki Kuhara, Osaka (JP); Mitsuaki Nishie, Yokohama (JP); Shigeo Hayashi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 616 days.

(21) Appl. No.: 10/971,644

(22) Filed: Oct. 21, 2004

(65) Prior Publication Data

US 2005/0110105 A1 May 26, 2005

(30) Foreign Application Priority Data

Oct. 22, 2003 (JP) .............................. 2003-362374
Oct. 28, 2003 (JP) .............................. 2003-367822

(51) Int. Cl.
*H04B 10/06* (2006.01)
(52) U.S. Cl. ...................... 398/202; 398/212; 398/213; 398/214
(58) Field of Classification Search ................ 398/202, 398/207, 212–214
See application file for complete search history.

(56) References Cited

U.S. PATENT DOCUMENTS

| | | | |
|---|---|---|---|
| 6,894,322 B2 * | 5/2005 | Kwan et al. ................ 257/186 |
| 6,934,478 B2 * | 8/2005 | Fujita et al. ................ 398/141 |
| 7,158,729 B2 * | 1/2007 | Yokomizo ................... 398/202 |
| 7,171,128 B2 * | 1/2007 | Hasegawa et al. .......... 398/202 |
| 7,215,886 B2 * | 5/2007 | Maruyama et al. ......... 398/117 |
| 2004/0071411 A1 * | 4/2004 | Nakanishi et al. ............ 385/92 |
| 2005/0100349 A1 | 5/2005 | Kuhara et al. |

FOREIGN PATENT DOCUMENTS

JP 63-077171 4/1988
JP 63-105541 5/1988

OTHER PUBLICATIONS

U.S. Appl. No. 11/006,192, dated Dec. 7, 2004, entitled "Photodetector and Optical Receiver".

* cited by examiner

*Primary Examiner*—Jason Chan
*Assistant Examiner*—Quan-Zhen Wang
(74) *Attorney, Agent, or Firm*—Fish & Richardson P.C.

(57) ABSTRACT

The present invention provides an optical receiver that uses an avalanche photodiode (APD) whose multiplication factor m is controlled to compensate the temperature dependence thereof. An optical module of the present invention includes a light-receiving device in addition to the APD. The light-receiving device may be a semiconductor thin film or a PIN photodiode, and is disposed in front of the APD. Accordingly, the light-receiving device receives a portion of signal light, and transmits a rest portion thereof. The APD receives the rest portion of the signal light. The bias voltage applied to the APD is so controlled that a first photocurrent generated in the light-receiving device and a second photocurrent generated in the APD maintain a constant ratio.

17 Claims, 15 Drawing Sheets

OPTICAL MODULE AND AN OPTICAL RECEIVER USING THE SAME

BACKGROUND OF THE INVENTION

1. Field of the Invention

The present invention relates to an optical module and an optical receiver using the optical module.

2. Related Prior Art

Japanese patent application published as S63-105541 has disclosed one type of an optical receiver, which has an avalanche photodiode (hereinafter denoted as APD), and a PIN photodiode (hereinafter denoted as PIN-PD) that receives light reflected by the APD. This optical receiver controls the bias voltage responding to the output from the PIN-PD.

Another Japanese patent application published as S63-077171 has disclosed another type of the optical receiver. This optical receiver provides a photodiode that includes a first region for receiving signal light and a second region for monitoring primarily the incident power of the signal light. Two photodiodes are formed on the single substrate. The APD is formed in the first region while the PIN-PD is formed in the second region. In this optical receiver, the bias voltage applied to the APD is controlled based on the output provided from the PIN-PD.

In the former optical receiver, the bias voltage applied to the APD is controlled based on the output from the PIN-PD that receives light reflected by the APD. Since the magnitude of the light reflected by the APD depends on the polarization of the light, the output current provided from the PIN-PD also depends on the polarization, whereby the bias voltage applied to the APD varies depending thereon.

In the latter optical receiver, the bias voltage applied to the APD is controlled by the output from the PIN-PD formed in the first region. However, the PIN-PD and the APD are integrally formed in the same substrate, so the output current from the PIN-PD is affected by the APD through the crosstalk.

SUMMARY OF THE INVENTION

Therefore, one object of the present invention is to provide an optical module and an optical receiver, which use a monitoring device with a simple structure and is independent from the polarization of the signal light and the electrical crosstalk.

According to one aspect of the present invention, an optical module for receiving an optical signal emitted from an optical fiber and outputting an electrical signal is provided. The optical module includes a light-receiving device and an APD. The light-receiving device receives a portion of the optical signal and outputs a first photocurrent, while a rest portion of the optical signal is transmitted therethrough and reaches the APD. The APD outputs a second photocurrent corresponding to the rest portion of the optical signal with an optical-to-electrical conversion efficiency. In the present optical module, the electrical signal is kept constant in average by adjusting the optical-to-electrical conversion efficiency of the APD.

The optical module may include a stem and a cover for forming a cavity with the stem where the APD is enclosed therein. The cover has an aperture for passing the rest portion of the optical signal. The optical module may have a lens to cover the aperture. The light-receiving device may be formed on a surface of the lens so as to dispose the light-receiving device between the optical fiber and the lens.

The optical module may include a lens formed on the light-receiving device that covers the aperture so as to dispose between said light-receiving device and the optical fiber. The light-receiving device may include a body and a carrier to forme the body thereon. The carrier may be transparent for the optical signal and the body may be a thin film made of semiconductor material selected from InGaAs, InGaAsP, CdSe, PbS, PbSe, InSb, SiGe, Si and Ge.

The optical module may include a stem and a cover to form a cavity together with the stem. The cavity encloses the light-receiving device and the avalanche photodiode therein. The stem mountes the avalanche photodiode thereon. The cover has an aperture.

The light-receiving device may be a PIN photodiode integrally formed with the avalanche photodiode on a same substrate. The substarate has a first surface and a second surface opposite to the first surface. The PIN photodiode is formed on the first surface and the avalanche photodiode is formed on a second surface. The optical module may further include a bench that has a groove. The optical fiber is sucured in the groove. The integrated device of the PIN photodiode and the APD is mounted on the bench such that the PIN photodiode faces the bench. The optical signal emitted from the optical fiber is reflected by the end surface towards the integrated device and enters the PIN photodiode. The PIN photodiode may have a ring shape with an opening in a center thereof. The rest portion of the optical signal passes through the opening and transmitts through the substrate to reach the avalanche photodiode. The PIN photodiode may have a buffer layer made of InP, an active layer made of InGaAs with a thickness, a window layer made of InP and a diffusion layer. The thickness of the active layer is determined by a transmittance to be desired to the avalanche photodiode.

According to another aspect of the present invention, an optical receiver is provided. The optical receiver receives an optical signal emitted from an optical fiber and outputs an electrical signal corresponding to the optical signal. The optical recevier comprises an optical module and a control unit. The optical module includes a light-receiving device and an APD. The light-receiving device receives a portion of the optical signal and outputs a first photocurrent corresponding to the portion of the optical signal. The light-receiving device transmits a rest portion of the optical signal. The APD receives the rest portion of the optical signal. The APD outputs a second photocurrent that corresponds to the rest portion of the optical signal with an optical-to-electrical conversion efficiency by applying a bias voltage. The control unit controls the bias voltage applied to the APD such that a ratio of the first photocurrent in average to the second photocurrent in average is maintained to be a preset value.

The contolr control unit may further include first and seocond circuits, a comparator and a DC/DC converter. The first circuit converts the first photocurrent to a corresponding first voltage signal. The second circuit converts the second photocurrent to a corresponding second voltage signal. The comparator compares the first voltage signal with the second voltage signal and outputs a control signal. The DC/DC converter outputs the bias voltage applied to the APD by receiving the control signal. The control circuit can adjust the bias voltage such that the first voltage signal is equal to the second voltage signal.

The first circuit may include a first reference resistor and the second circuit may include a second reference resistor. The ratio is determined by the first resistor and the second resistor.

The second circuit may include a first current mirror circuit having an input terminal connected to the DC/DC converter, first output terminal connected to the second reference resistor, and a second output terminal connected to the APD. The second photocurrent generated by the APD is mirrored to the first output terminal of the first current mirror circuit.

The light-receiving device may be a PIN photodiode integrally formed with the APD on a same substrate so as to have a common cathode. The second circuit includes a first current miter circuit having an input terminal connected to the DC/DC converter, a first output terminal connected to the second reference resistor and the first input terminal, and a second output terminal connected to the common cathode. The first circuit may include a second current mirror circuit having a first input terminal connected to the second reference resistor, a second input terminal connected to an anode of the PIN photodiode, an output terminal and the first reference resistor connected to the output terminal. The first and second output terminals of the first current mirror circuit each come out a sum of the first photocurrent and the second photocurrent. The first and second input terminals of the second current mirror circuit each come in the first photocurrent. Accordingly, the first reference resistor flows only the first photocurrent therein, and the second reference resistor flows only the second photocurrent therein.

DETAILED DESCRIPTION OF PREFERRED EMBODIMENTS

Preferred embodiments of optical modules and optical receivers according to the present invention will be described as referring to accompanying drawings.

Figure 1:
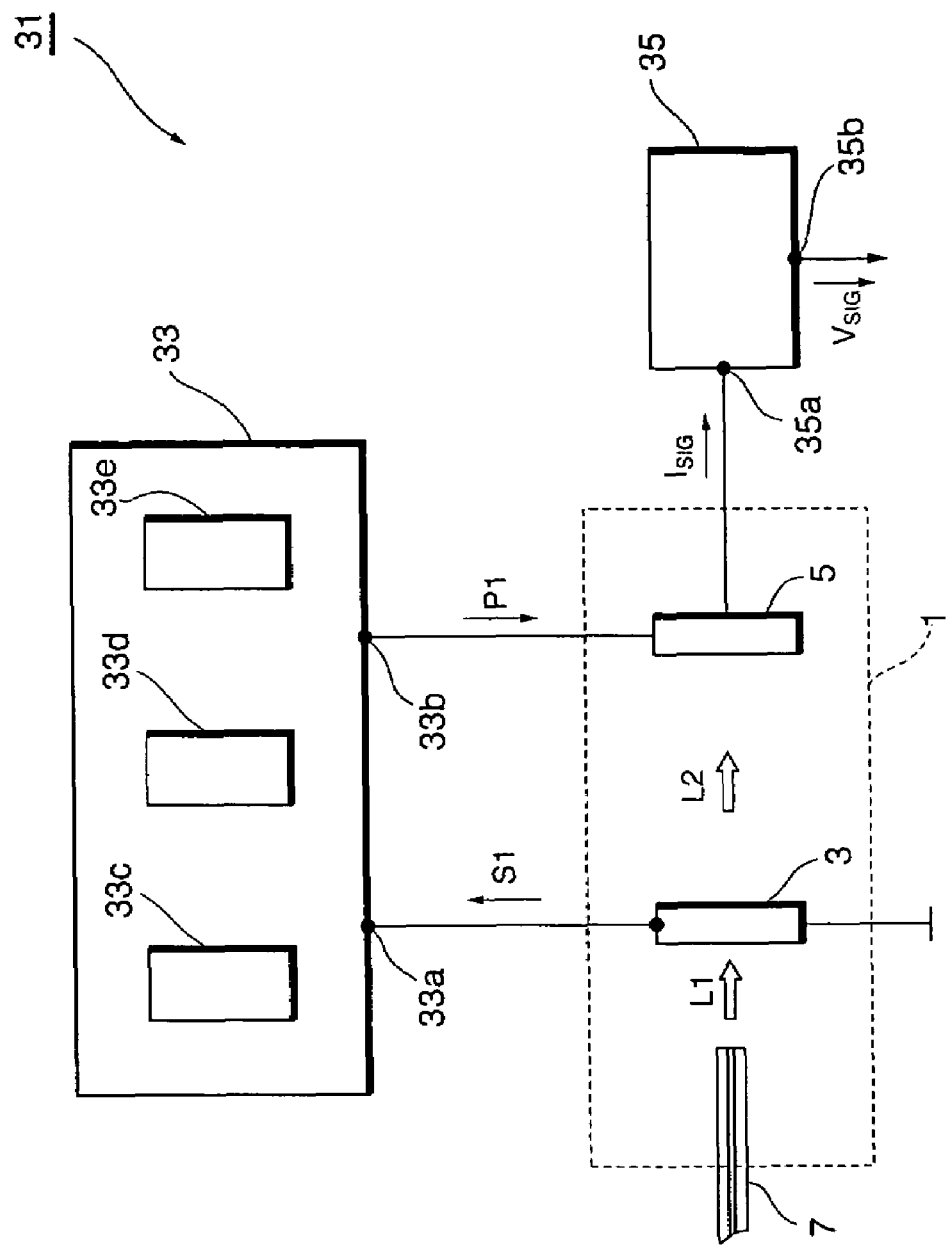
FIG. 1 is a block diagram showing a mechanism of an optical receiver according to the present invention.

FIG. 1 is a block diagram of an optical receiver according to the present invention, which describes a mechanism of the present invention. The optical receiver 31 includes an optical module 1, a control unit 33, and a signal-processing unit 35. The control unit 33 has a terminal 33a for receiving a signal S1 from a light-receiving device 3 and another terminal 33b for providing a bias voltage P1 to an avalanche photodiode (hereinafter denoted as APD) 5. The signal-processing unit 35 has a terminal 35a for receiving a signal $I_{SIG}$ from the APD 5 and another terminal 35b for providing a processed signal $V_{SIG}$ to the outside of the optical receiver 31. In the optical receiver 31 shown in FIG. 1 may control the bias P1 provided for the APD 5 based on the signal S1 provided from the light-receiving device 3. The light-receiving device 3 may be a photoconductive film or a photvoltaic device such as a photodiode.

The light-receiving device 3 receives light L1 output from an optical fiber 7 and converts a portion of light L1 into a corresponding electrical signal S1. The APD 5 receives light L2 transmitted through the light-receiving device 3 and converts the light L2 into a corresponding electrical signal. The control unit 33, responding to a current flowing in the APD 5 and to the signal S1, controls the bias voltage P1 provided to the APD 5.

The optical receiver 31 may control the current multiplication factor of the APD 5 by varying the bias voltage P1 supplied thereto responding to magnitude of the light received by the light-receiving device 3.

Figure 2:
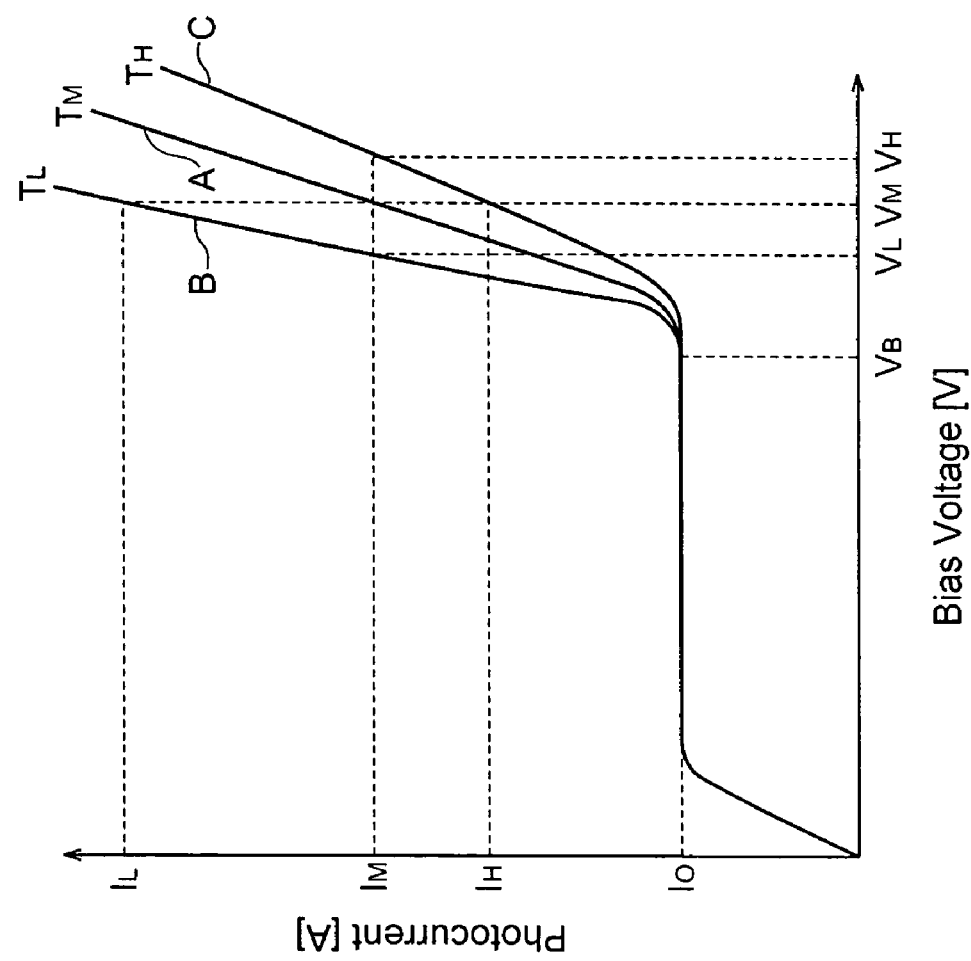
FIG. 2 shows a temperature dependence of an avalanche photodiode.

The operation of the control unit 5 will be described in the following. FIG. 2 shows the dependence of photocurrents generated by the APD 5 on the bias voltage. In FIG. 2, the magnitude of the light incident in the APD 5 is kept constant. When the bias voltage is smaller than a characteristic value $V_B$, the APD 5 generates a current $I_0$ independent on the bias voltage supplied thereto. This situation is called as "PIN-mode". On the other hand, when the bias voltage exceeds the characteristic value $V_B$, the APD 5 shows a carrier multiplication function and the photocurrent obtained from the APD 5 drastically increases as the bias voltage increases, and the magnitude of the photocurrent becomes a product of the steady current $I_0$ multiplied by the multiplication factor m.

The carrier multiplication function depends on temperatures of the APD 5. For example, as shown in FIG. 2, behaviors of A, B and C correspond to characteristics of the APD 5 under temperatures $T_M$, $T_L$, and $T_H$ ($T_L < T_M < T_H$), respectively. Thus, even when the magnitude of light incident in the APD 5 and the bias voltage supplied thereto are kept constant, the photocurrent obtained from the APD 5 varies as $I_H$, $I_M$ and $I_L$ depending on the temperature of the APD 5.

In FIG. 2, when the photocurrent $I_M$, which is equal to a product of m and $I_0$ where m is a multiplication factor of the APD 5, can be obtained, the bias voltage supplied to the APD 5 is to be varied as $V_L$, $V_M$ and $V_H$ as the temperature varies. In a conventional optical receiver, the bias voltage supplied to the APD is varied based on the temperature thereof measured by a thermistor. However, due to scattered characteristics of the APD, it is hard to precisely define the desired multiplication factor.

On the other hand, the multiplication factor of the APD 5 is controlled based on the output provided from the light-receiving device 3 in the present control unit 33. Assuming that Ia2 is the photocurrent generated by the APD 5 in the PIN-mode and Ip2 is a current derived from the light-receiving device 3, where both currents are obtained at a condition that light with a preset magnitude is incident in the optical receiver 31, the bias voltage P1 supplied to the APD 5 is controlled such that the photocurrent obtained from the APD 5 is equal to a value:

m*Ip*(Ia2/Ip2), where m is a desired multiplication factor and Ip is a current derived from the light-receiving device 3 under the practical operation of the optical receiver 31. Accordingly, the desired multiplication factor m can be obtained independent on the change of the operating temperature. In the analysis above mentioned and embodiments described hereinbelow, the photocurrent generated by the light-receiving device and the APD means an average current even if the optical signal input to the optical receiver is a switched signal repeating ON and OFF states.

First Embodiment

Figure 3:
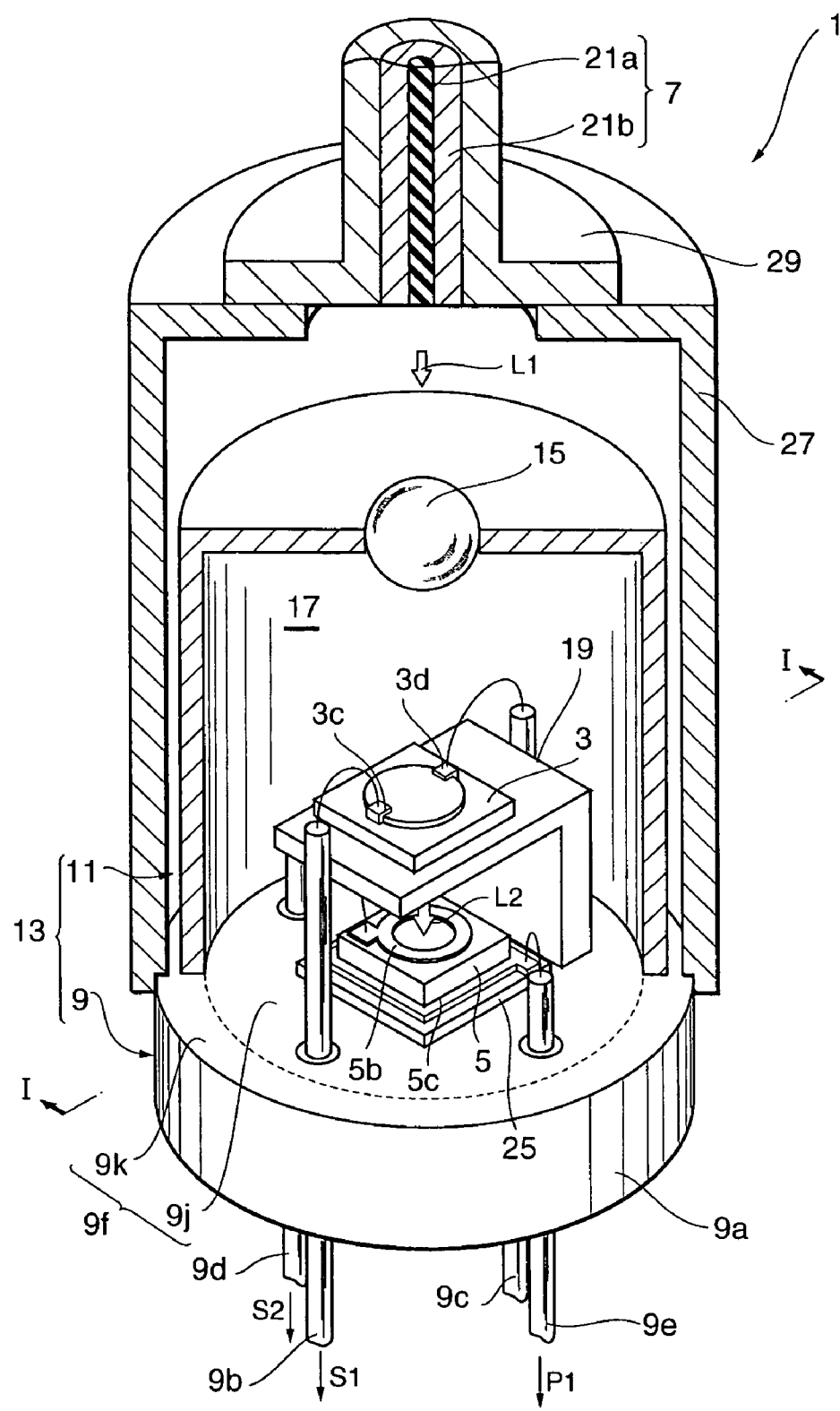
FIG. 3 is a partially cutaway perspective view of an optical module according to the first embodiment.
Figure 4:
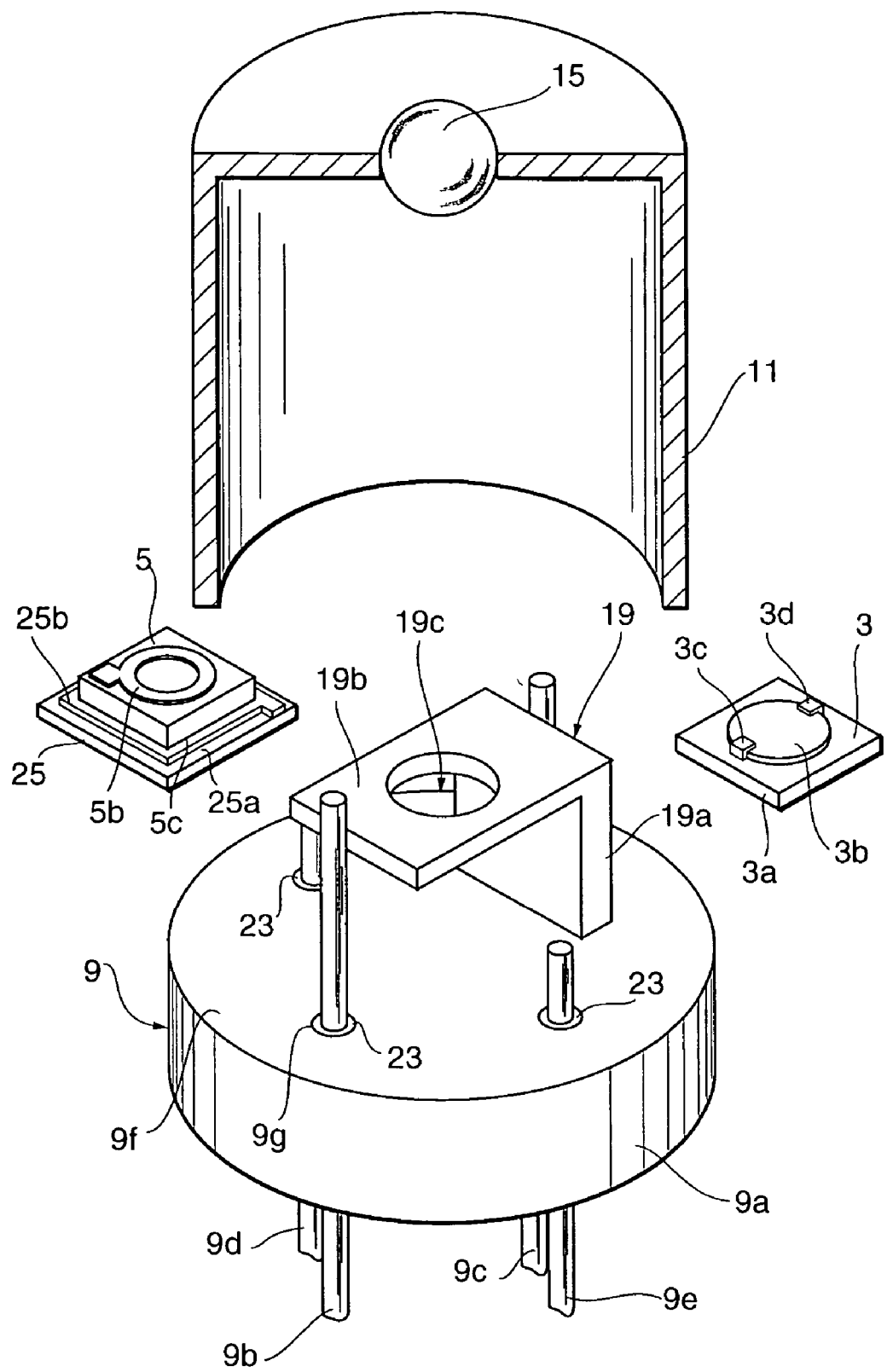
FIG. 4 is an exploded view of the optical module according to the first embodiment.

FIG. 3 is a partially cutaway perspective view and FIG. 4 is an exploded view of an optical module 1 according to the first embodiment of the present invention.

The optical module 1 includes a light-receiving device 3 and an APD 5, a housing 13 comprising a stem 9 and a cover 11, an alignment member 27 surrounding the cover 11, and a sleeve 29 for securing a fiber assembly 7, an optical fiber 21a and a ferrule 21b are included therein. The light-receiving device 3 receives light L1 from the optical fiber 21a. The APD 5 receives light L2 transmitted through the light-receiving device 3. The stem 9 mounts APD 5 and the cover 11 thereon, and forms a cavity 17 with the cover 11 for enclosing the APD 5 and the light-receiving device 3 therein. The cover 11 has an aperture 15 on a top thereof. The light-receiving device 3 positions between the APD 5 and the aperture 15.

The fiber assembly 7 optically couples with the aperture 15, and the aperture 15 optically couples with the light-receiving device 3. The fiber assembly 7 includes an optical fiber 21a and a ferrule 21b for securing the optical fiber 21a. The aperture 15 has a glass plate or a lens to airtightly seal the cavity 17.

The stem 9 includes a base 9a and a plurality of leads 9b to 9e. The base 9a has a plurality of via holes 9g through which corresponding leads from 9b to 9e pass. Between leads and via holes 9b to 9e are filled with a seal glass 23, which airtightly seals the cavity 17. The stem 9 has a first region 9j and a second region 9k surrounding the first region 9j, and the cover 11 is placed on the boundary between first and second regions 9j and 9k, respectively. Leads 9b to 9e are disposed in the first region 9j.

On the base 9a, a mount 19 is disposed for mounting the light-receiving device 3 thereon. The mount 19 includes a first portion 19a extruding from the base 9a and a second portion 19b extending in parallel to the base 9a. The second portion further includes an aperture 19c through which the light L2 transmitted through the light-receiving device 3 passes, and the light-receiving device 3 is mounted on the second portion 19b so as to cover the aperture 19c.

The light-receiving device 3 may include a carrier 3a and a body 3b. The carrier 3a supports the body 3b and is made of material transparent to the light under consideration, such as silica glass or resin. The body 3b may be a photoconductor made of semiconductor thin film or a semiconductor photodiode each made of InGaAs, InGaAsP, CdSe, PbS, PbSe, InSb, SiGe, Si and Ge. Two electrodes 3c and 3d are provided on the surface of the body 3b, one of which 3c is connected to the lead 9b while the other of which 3d is connected to the other lead 9c.

The APD 5 may have sensitivity to light from 1.0 μm to 1.6 μm. As shown in FIG. 4, the APD 5 has two electrodes 5b and 5c on the surface thereof, and mounted on a submount 25 having a conductive pattern 25b provided thereon. One electrode 5b is connected to the lead 9d, while the other electrode 5c is coupled to the other lead 9e via the conductive pattern 25b.

The lead 9b and 9d are provided for extracting the signal $S_1$ from the light-receiving device 3 and the signal $S_2$ from the APD 5, respectively. The lead 9e is provided for supplying the bias voltage to the APD 5. Lengths of leads 9d and 9e extending from the stem 9 are shorter than that of leads 9b and 9c, and the APD 5 is connected to the shorter leads 9d and 9e.

An alignment member 27, that is a tubular member, surrounds the cover 11 and the stem 9. On the alignment member 27 is provided a sleeve 29 that secures the fiber assembly 7.

Figure 5:
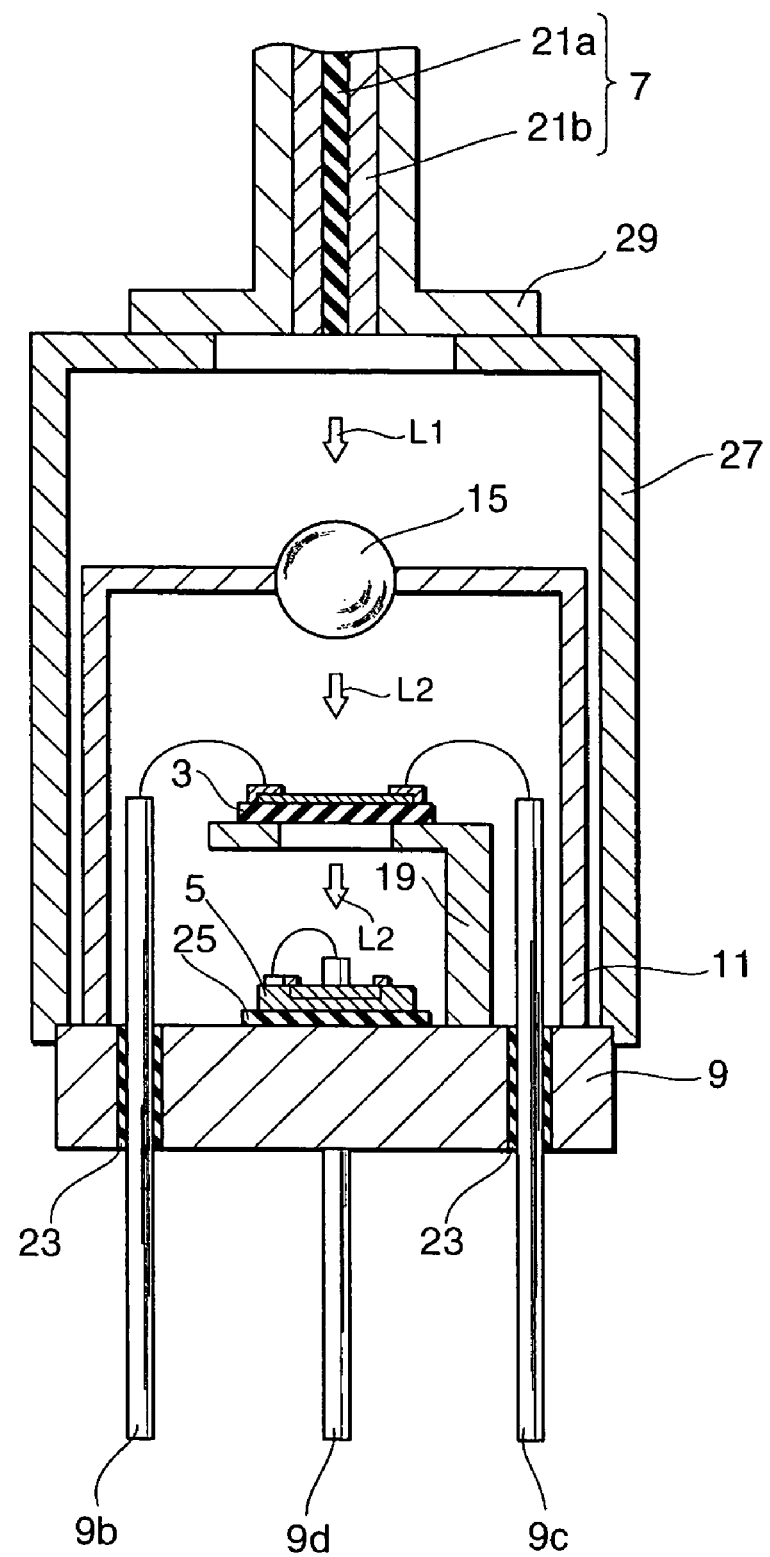
FIG. 5 is a cross sectional of the optical module according to the first embodiment.

FIG. 5 is a cross section taken along the line I-I in FIG. 3. Since the light-receiving device 3 is mounted on the mount 19 different to and apart from the position where the APD 5 is mounted, electrical crosstalk between the light-receiving device 3 and the APD 5 is not induced therebetween. Moreover, since the light reflected from the surface of the light-receiving device 3 is not used for controlling the bias voltage of the APD 5, the control thereof is independent on the polarization of the light.

Figure 6A:
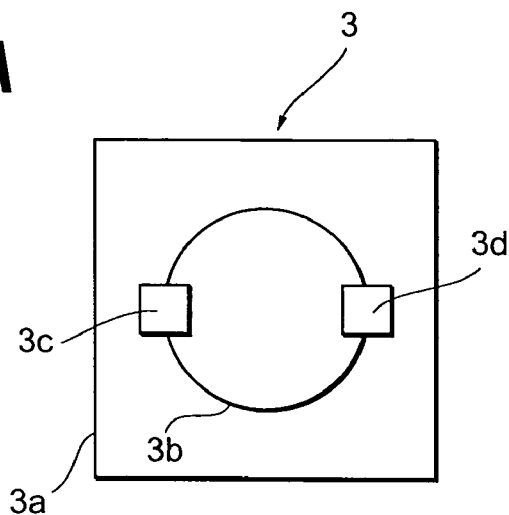
FIG. 6A to FIG. 6C are plan views showing light-receiving devices applied in optical module of the first embodiment.
Figure 6B:
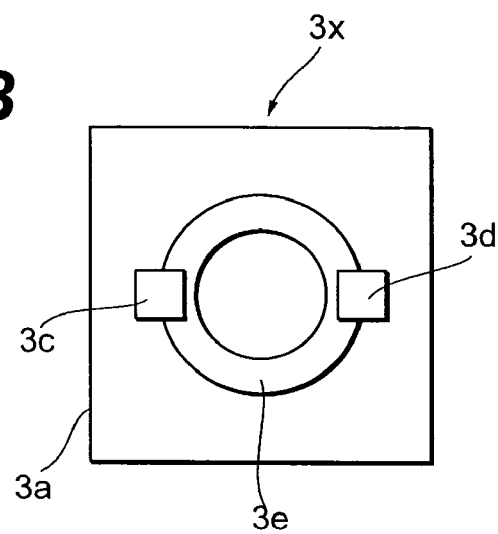
Figure 6C:
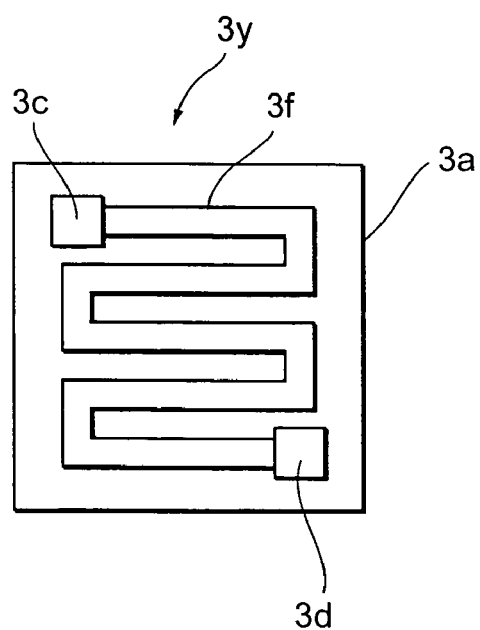

FIG. 6A is a plan view showing the light-receiving device 3. The body 3b of the light-receiving device 3 is positioned in the center of the carrier 3a. FIG. 6B and FIG. 6C are plan views showing modified configurations of the light-receiving device 3. The light-receiving device 4a in FIG. 6B has the body 3e of a doughnut shape, while the body 3f in FIG. 6C has a zigzag shape. In these light-receiving devices shown in FIGS. 6A to 6C, one end of the body is connected to the electrode 3c and the other end thereof is connected to the other electrode 3d. In FIGS. 6B and 6C, the light reaching the APD 5 passes in most part thereof through the portion of the carrier 3a on which the body 3e and 3f are not formed.

Figure 7:
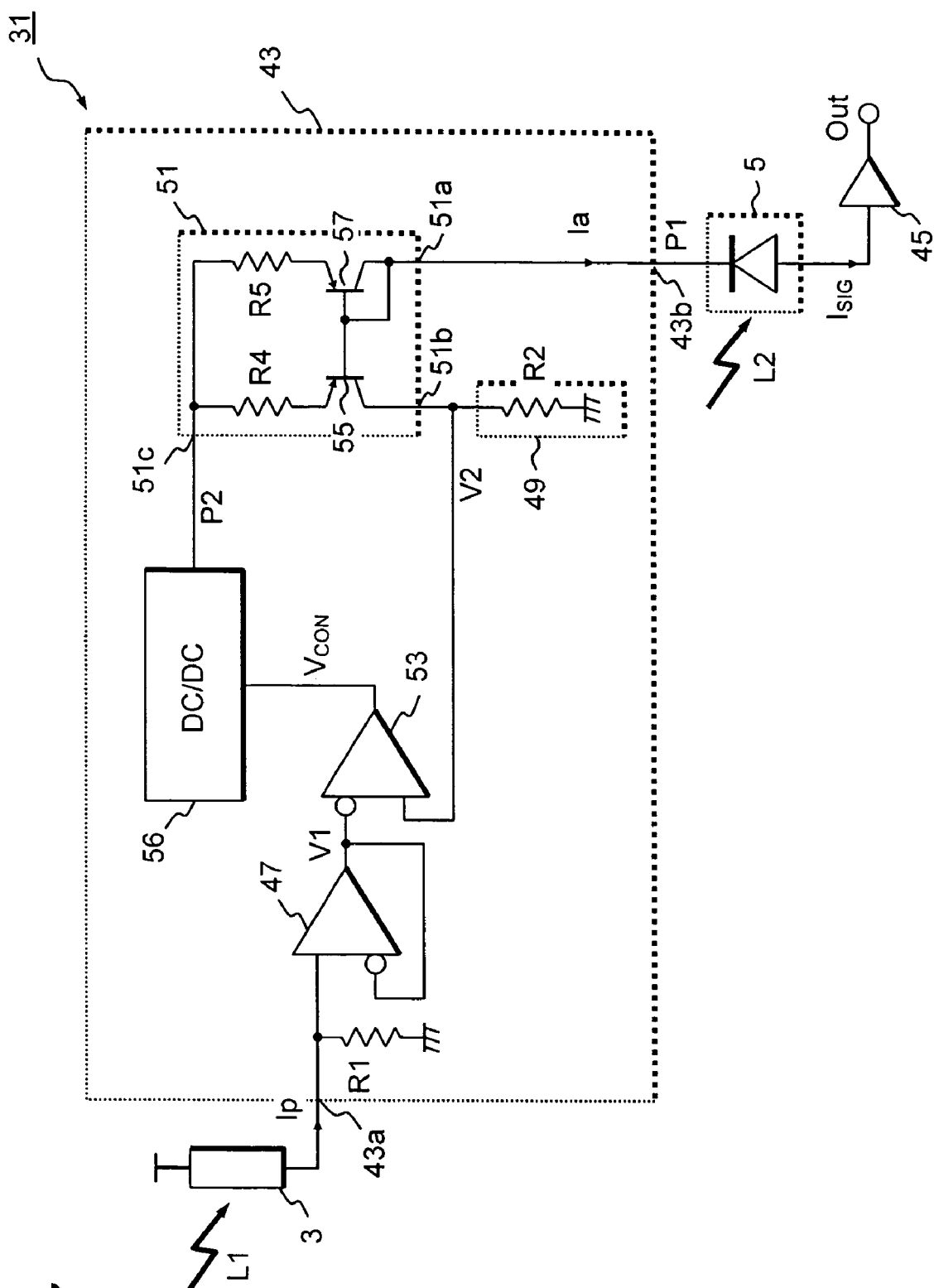
FIG. 7 is a circuit diagram of an optical receiver using the optical module of the first embodiment.

Next, the control unit 31 of the optical receiver will be described as referring to FIG. 7 and FIG. 8. FIG. 7 is a circuit diagram of the optical receiver 31 using the optical module 1 shown in FIG. 3. In FIG. 7, the control unit 43 has first terminal 43a for receiving a signal V1 from the light-receiving device 3, and a second terminal 43b for outputting the bias voltage P1 to the APD 5. The signal processing unit 45 has an input terminal 45a for receiving a current signal $I_{SIG}$ from the APD 5, and an output terminal 45b for outputting the signal $V_{OUT}$ to the outside of the optical receiver 31. Moreover, the control unit 43 includes an input buffer 48 that includes a load resistor R1, a current-to-voltage converter (hereinafter denoted as I/V-converter) 49, a current mirror circuit 51, a comparator 53 and a DC/DC converter 56.

The input buffer 48 receives the photocurrent Ip output from the light-receiving device 3 and converts it to a voltage signal V1 corresponding to magnitude of the light L1 incident in the optical receiver 31 by a reference resistor R1. Since the input buffer 48 operates as a voltage follower, the signal V1 is directly transferred to the output of the input buffer 48 and input to the comparator 53.

The current mirror circuit 51 has two output terminals 51a and 51b, one input terminal 51c, and two transistors 55 and 57. From one output terminal 51a comes out the current flowing in the APD 5, the other output terminal 51b comes out the current corresponding to that coming out from the terminal 51a. The input terminal 51c receives the voltage P2 from the DC/DC converter 56 and transmits it to two transistors 55 and 57 via resistors R4 and R5. Since two transistors 55 and 57, bases of which are connected to each other, have the same configuration and a symmetrical relation, the current coming out from the first output terminal 51a may be reflected to the current coming out from the second output terminal 51b.

The I/V-converter 49, which is a resistor R2 in this embodiment, generates a voltage signal $V_2$ corresponding to the current coming out from the second output terminal 51b of the current mirror circuit 51. The comparator 53 compares thus converted voltage signal $V_2$ with the signal $V_1$ generated by the input buffer 48, and generates the control signal $V_{CONT}$. The DC/DC-converter 56 generates, by receiving the control signal $V_{CONT}$, the voltage P2, which becomes the bias voltage P1 supplied to the APD 5 via the current mirror circuit 51.

In the control unit 43, the photocurrent Ip generated in the light-receiving device 3 is converted to the corresponding voltage signal $V_1$ by the resistor R1, i.e. $V_1=Ip*R1$. On the other hand, the current Ia flowing in the APD 5 is reflected to the current coming out from the second output terminal 51b of the current mirror circuit 51, and converted to the voltage signal $V_2$ by the resistor R2, i.e. $V_2=n*Ia*R2$ assuming that n is the ratio of the currents coming out from respective terminals 51a and 51b of the current mirror circuit 51, whish is defined by the size of two transistors 55, 57 and two resistors. The comparator 53, receiving the signal $V_1$ in the inverting input thereof and the signal $V_2$ in the non-inverting input, compares these two signals $V_1$ and $V_2$, and outputs the control signal $V_{CONT}$ to the DC/DC-converter 56. The DC/DC-converter 56 generates the supply voltage P2 so as to make these two signals $V_1$ and $V_2$ becomes equal to each other. Therefore, the ratio of the current Ia flowing in the APD 5 to the current Ip flowing in the light-receiving device 3 becomes R1/n/R2 in the steady state.

Figure 8:
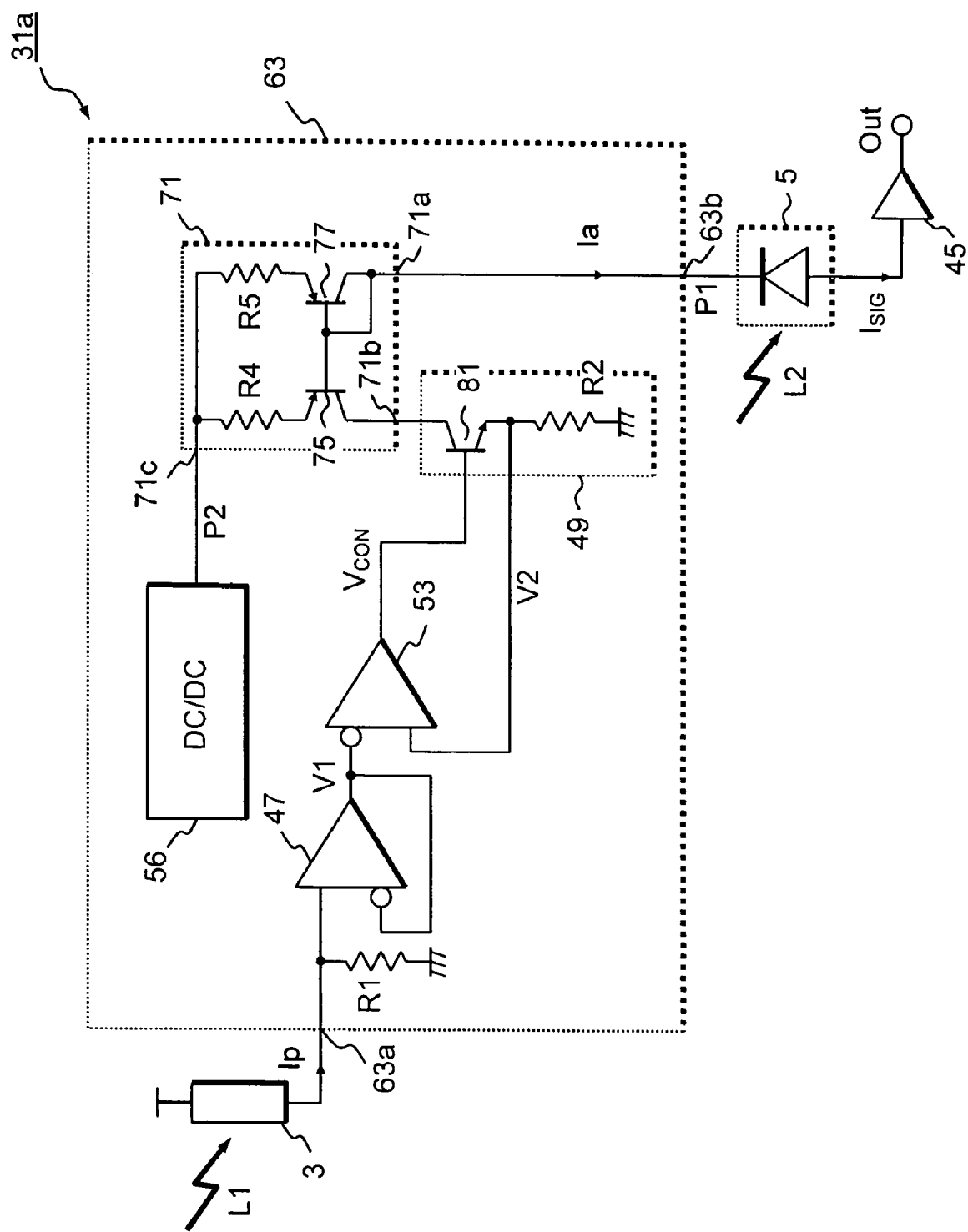
FIG. 8 is a modified circuit diagram of the optical receiver.

FIG. 8 is another circuit diagram of a modified optical receiver 61. In this optical receiver 61, the control unit 63 has a different current mirror circuit 71, an I/V-converter 49, and a comparator 73. The current mirror circuit 71 has a configuration that the first output terminal 71a, from which the current Ia comes out, is connected to the collector of the transistor but the base and the collector thereof are not short circuited. The I/V-converter 49 includes, in addition to the resistor R2, a transistor 81 whose collector is connected to the second output terminal 71b of the current mirror circuit 71 and the emitter is connected to the resistor R2. The comparator 73 compares two voltages $V_1$ and $V_2$ similar to the previous described control unit shown in FIG. 7, but outputs the control signal $V_{CONT}$ to the base of the transistor 81 of the I/V-converter not to the DC/DC-converter 76. In this control unit 63, receiving the signal from the light-receiving device 3, generating the voltage signal V1 by the first reference resistor R1, and comparing this signal V1 with the other signal V2, which directly reflects the current flowing in the APD 5, the bias voltage P1 supplied to the APD 5 may be adjusted so as to make two voltages V1 and V2 equal to each other by changing the collector emitter voltage $V_{CE}$ of the transistor 75 in the current mirror circuit 71. Thus, in the steady state, the ratio of the photocurrent Ia flowing in the APD 5 to the photocurrent Ip flowing in the light-receiving device 3 becomes R1/n/R2.

Second Embodiment

Figure 9:
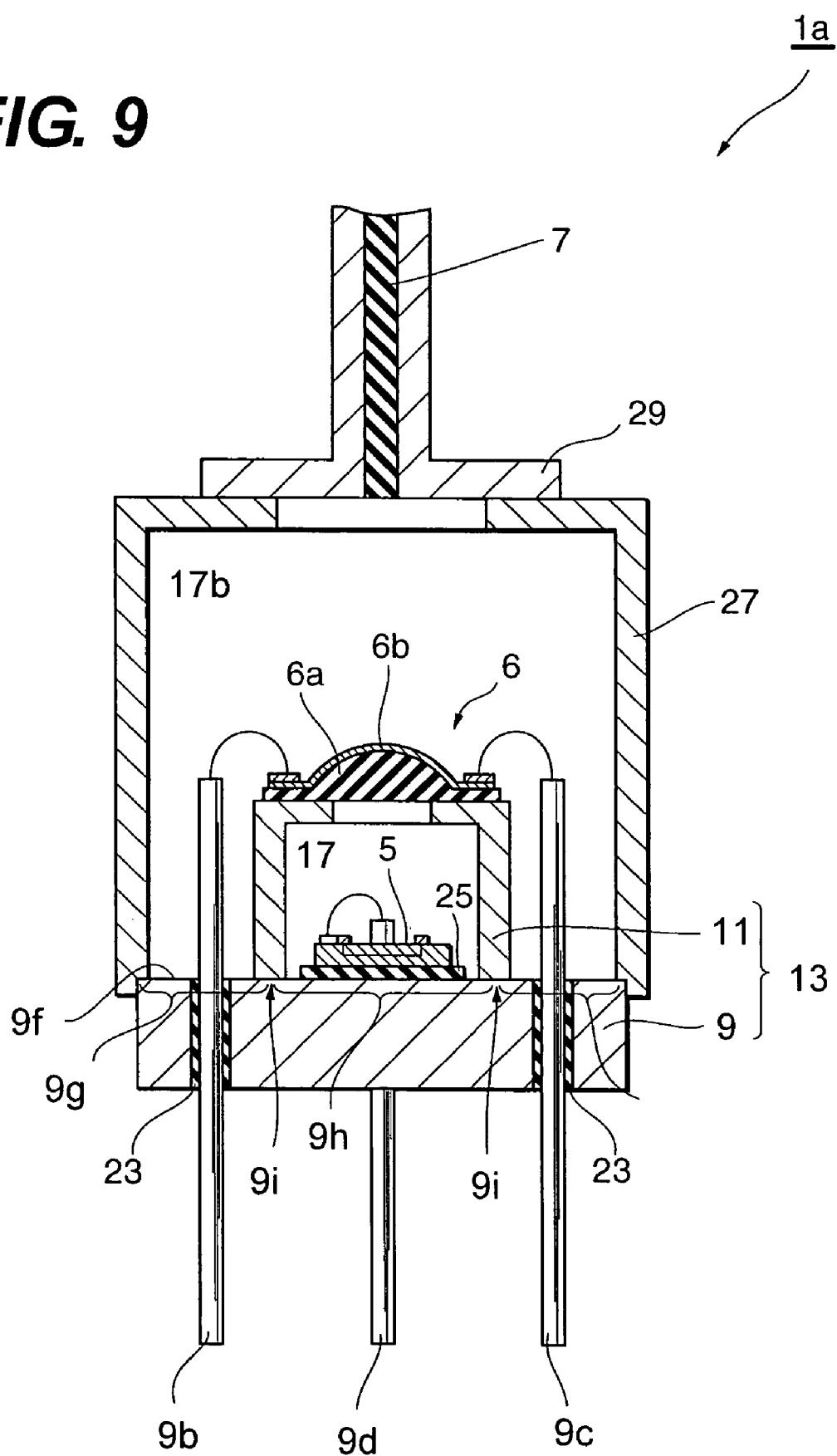
FIG. 9 is a cross sectional view of an optical module according to the second embodiment.

FIG. 9 is a cross section of an optical module 1a according to the second embodiment of the invention. In this optical module 1a, the cover 11 mounts the lens 6a and the lens 6a secures the light-receiving device 6 thereon. The APD 5 is mounted on the stem 9 and enclosed in the cavity 17a formed by the stem 9 and the cover 11, while the light-receiving device 6 is enclosed in another cavity 17b formed by the stem 9, the cover 11 and the alignment member 27. Some of leads 9b and 9c extrude into the second cavity 17b in this embodiment. 61 The carrier 6a of the present module has a shape convex toward the fiber assembly 7, and the body 6b of the light-receiving device 6 is formed on the convex surface of the body 6a. The light emitted from the fiber assembly 7 enters the body 6b and is absorbed thereby a portion thereof. The rest portion of the light transmits the body 6b and is converged by the convex surface of the carrier 6a, transmitted therethrough and enters the APD 5. Since the present optical module 1a provides the light-receiving device 6 with the body 6a having the convex shape, the lens which is provided in the optical module 1 shown in FIG. 3 is unnecessary to cover the aperture of the cover 11. The body 6a of the present invention can also be made of glass or resin similar to the aforementioned embodiment.

Third Embodiment

Figure 10:
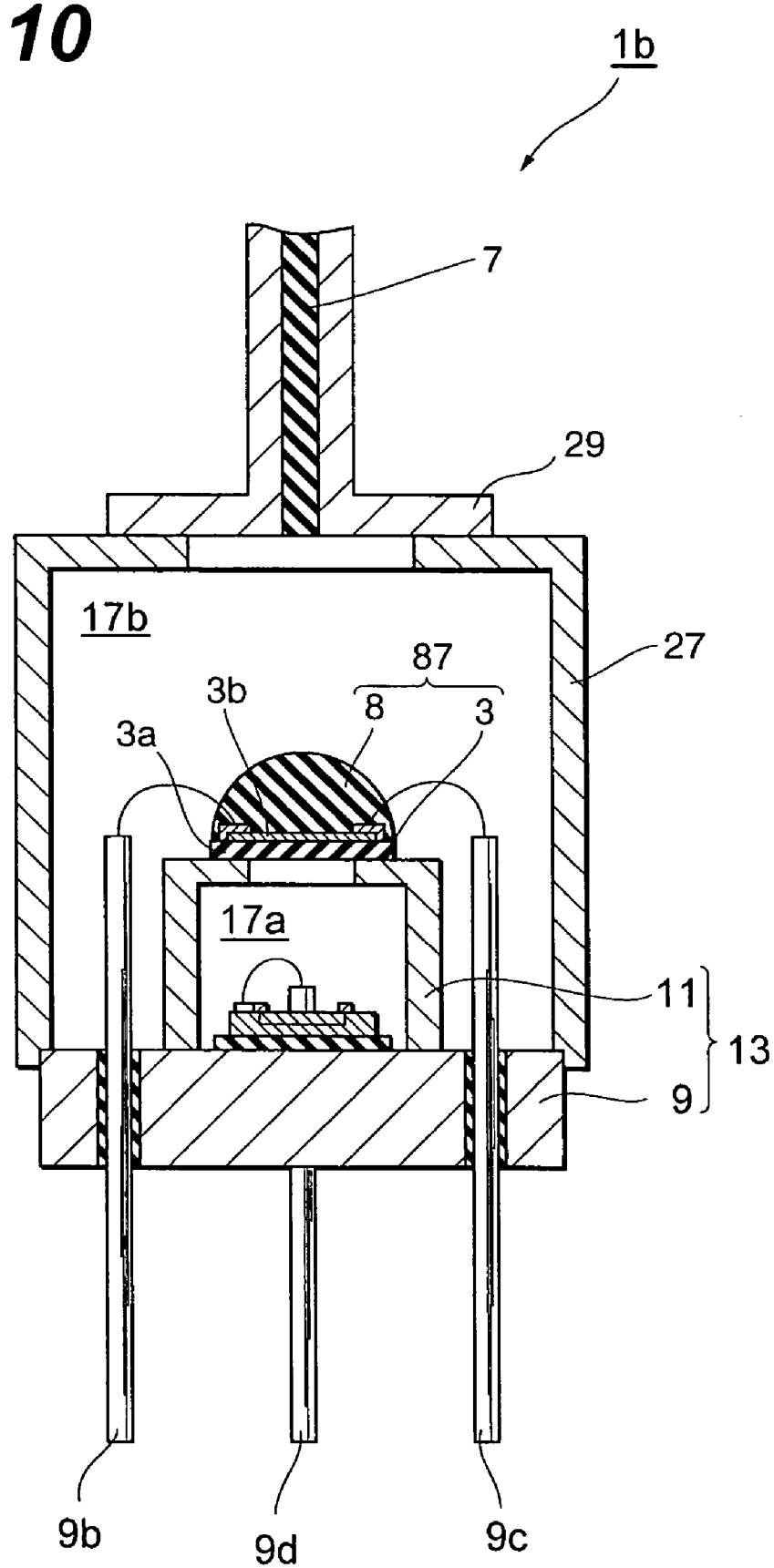
FIG. 10 is a cross sectional view of an optical module according to the third embodiment.

FIG. 10 is a cross section of an optical module 1b according to the third embodiment. Similar to the second embodiment, the optical module 1b has the housing 13 including the stem 9 and the cover 11, and the alignment member 27. The stem 9 and the cover 11 form the first cavity 17a while the cover 11, the alignment member 27, and the stem 9 form the second cavity 17b. The cover 11 has an opening covered by the light-receiving device 3 including the carrier 3a and the base 3b. On the light-receiving device 3 is provided a resin 8 that has an outer surface convex toward the fiber assembly 7. Also in this optical module 1b, light emitted from the fiber assembly 7 enters the resin 8, converged thereby and enters the light-receiving device 3. A portion of light thus entering the light-receiving device 6 is absorbed therein, while rest portion of the light transmits the light-receiving device 3 and reaches the APD 5 mounted on the stem 9.

Forth Embodiment

Figure 11:
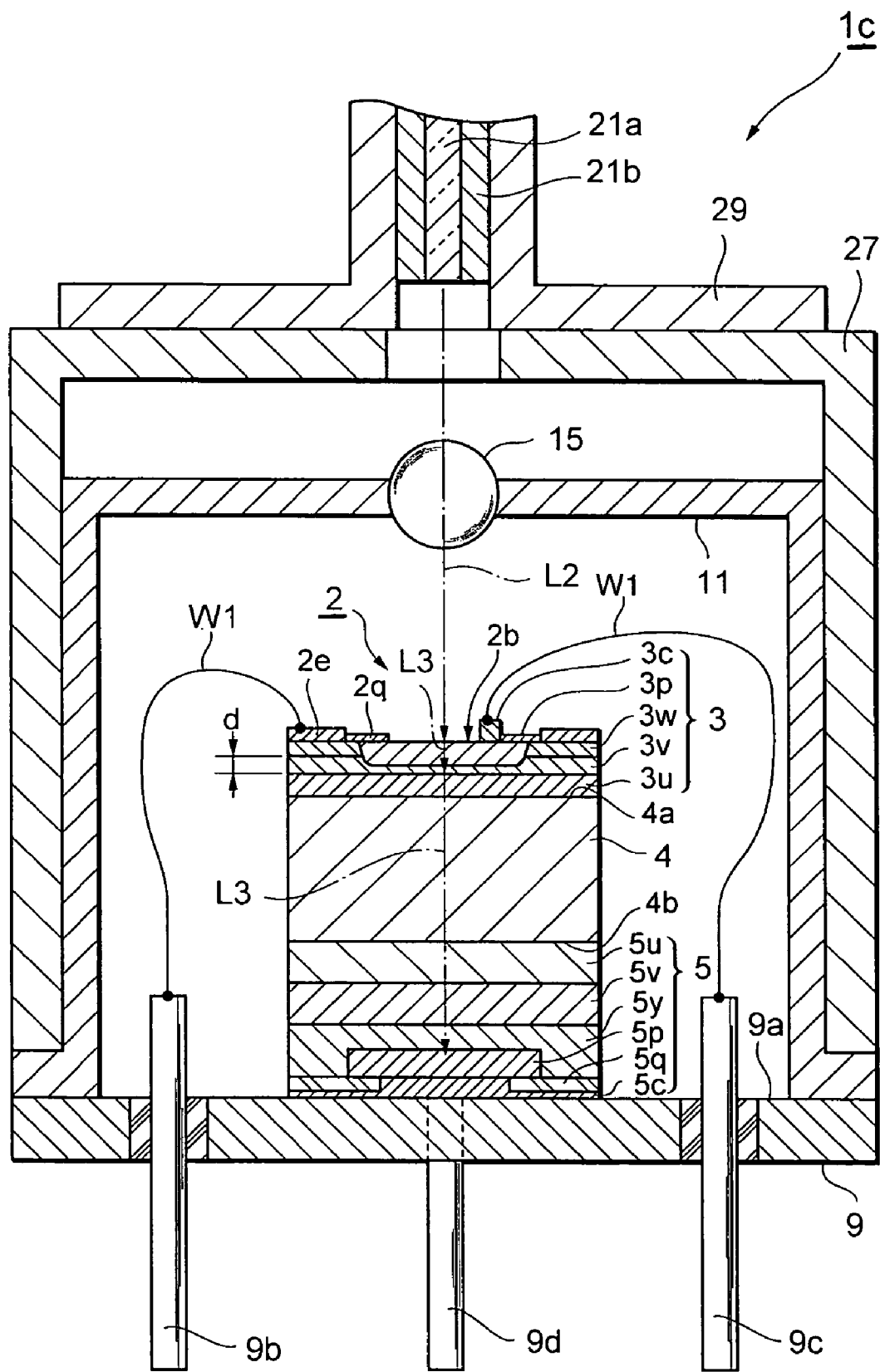
FIG. 11 is a cross sectional view of an optical module according to the fourth embodiment.

FIG. 11 is a cross section of an optical module 1c according to the forth embodiment of the present invention. In the present optical module 1c, the light-receiving device 3 and the APD 5 are integrally formed in the same semiconductor substrate. That is, the optical module 1c has an integrated light-receiving device 2 that integrates a PIN-PD 3 and an APD 5 in a same semiconductor substrate 4 instead of the independent devices shown in previously described embodiments.

The integrated light-receiving device 2 includes the PIN-PD 3, the substrate 4 and the APD 5, disposed and formed in this order. The substrate 4, made of an $n^+$-InP with a thickness of 100 to 300 µm, has a first surface 4a on which the PIN-PD 3 is formed and a second surface 4b on which the APD 5 is formed. The substrate 4 has a substantial transmittance for the signal light in order to transmit light incident on the first surface 4a to the second surface 4b thereof.

The PIN-PD 3 has a buffer layer 3u, an active layer 3v, a window layer 3w and a diffusion layer 3p in this order from the substrate 4. The buffer layer 3u is an n-InP with a thickness of 1 to 2 µm to block dislocations formed in the substrate 4 from diffusing in the active layer 3v. The active layer 3v is an n-InGaAs, a thickness of which will be descried later. The window layer 3w is made of material having band gap energy wider than that of the active layer 3v, typically InP, and has a thickness of 1 to 3 μm. The diffusion layer 3p, formed by diffusing dopant atoms from the surface of the window layer 3w by a thickness of 1.5 to 4.5 μm. Since the magnitude of the transmitted light through the PIN-PD 3 depends on the thickness of the active layer 3v, the thickness thereof is adjusted such that a desired transmittance for the optical module 1c is obtained. The following table 1 summarizes specifications, the material and the thickness, of respective layers.

TABLE 1

Material and thickness of the PIN-PD

| Layer | | material | thickness (μm) |
|---|---|---|---|
| buffer | 3u | n-InP | 1-2 |
| active | 3v | n-InGaAs | optional |
| window | 3w | InP | 1-3 |
| diffusion | 3p | InP/InGaAs | 1.5-4.5 |

Next, a way to determine the thickness d of the active layer 3v will be described for a case that the active layer 3v is made of n-InGaAs. Assuming a parameter a is the absorption co-efficient of the InGaAs for the signal light, the relation between the transmittance T and the thickness d of the active layer becomes:

$$d = -ln(T)/\alpha \quad (1)$$

Since the absorption co-efficient α of InGaAs is about $1.3 \times 10^4$/cm, the above equation (1) becomes, $$d[\mu m] = -ln(t)/1.3. \quad (2)$$

When the desired transmittance is 90%, the thickness d of the active layer 3v may be calculated to be 0.081 μm. When the transmittance to be obtained is 99%, the thickness d should be 0.0077 μm, namely 7.7 nm. This relation of the thickness and the absorption co-efficient can be similarly applied to the light-receiving device 3 with a film shape used in the previous embodiments.

On the surface of the diffusion layer 3p provides an anode electrode 3c so as to be in contact with the diffusion layer 3p. The anode electrode 3c is connected to the lead 9c via a wire W1.

The APD 5 includes a buffer layer 5u, an active layer 5v, a multiplication layer 5y and a diffusion layer 5p. These layers are formed on the second surface 4b of the substrate 4 in this order. The buffer layer 5u is an n-InP with a thickness of 1 to 2 μm, the active layer 5v is an n-InGaAs with a thickness of 2 to 3 μm, the multiplication layer 5y is an n-InP with a thickness of 2 to 4 μm, and the diffusion layer 5p is formed by the diffusion of Zn atoms by a thickness of 1 to 2 μm into the active layer 5v. The table 2 show below summarizes specification of layers of the APD 5.

TABLE 2

Materials and thickness of the APD

| Layer | | material | thickness (μm) |
|---|---|---|---|
| buffer | 5u | n-InP | 1-2 |
| active | 5v | n-InGaAs | 2-3 |
| multiplication | 5y | n-InP | 2-3 |
| diffusion | 5p | Zn doped in active and multiplication layers | 1-2 |

On the surface of the diffusion layer 5p provides an anode electrode 5c so as to be in contact with the diffusion layer 5p. The anode electrode 5c is in contact with the stem 9 that is connected to the lead 9d. Between the anode electrode 5c and the multiplication layer 5y provides an insulating layer 5q that electrically isolates the anode electrode 5c from the multiplication layer 5y.

Moreover, the integrated light-receiving device 2 has a common electrode 2e formed on and in contact with the window layer 3w of the PIN-PD 3. Between the common electrode 2e and the diffusion layer 3p provides an insulating layer 3q to electrically isolate therebetween. The common electrode 2e is connected to the lead 9b with a wire W2. A voltage applied between the common electrode 2e and the anode electrode 3c functions as a bias voltage to the PIN-PD 3. On the other hand, by providing a voltage between the common electrode 2e and the anode electrode 5c of the APD 5. The photocurrent generated in the PIN-PD 3 flows between the common electrode 2e and the anode electrode 3c of the PIN-PD 3, while the photocurrent generated in the APD 5 may flows between the common electrode 2e and the anode electrode 5c of the APD 5.

Figure 12:
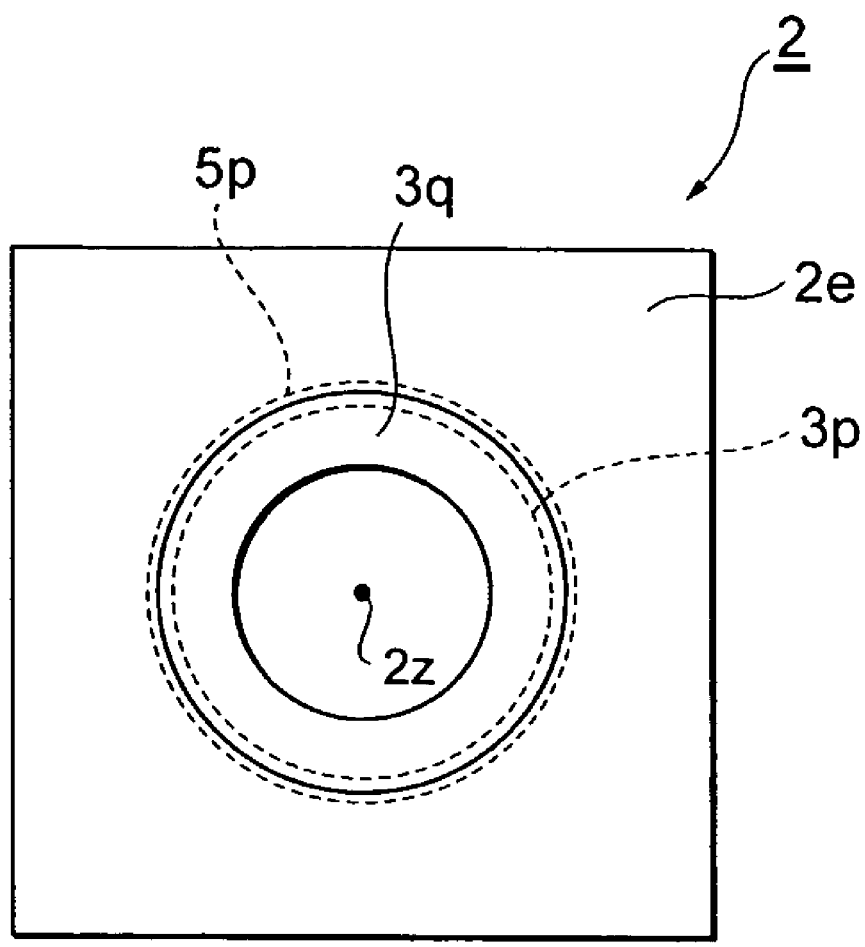
FIG. 12 is a plan view showing a light-receiving device integrally formed with an avalanche photodiode used in the optical module of the fourth embodiment.

FIG. 12 is a plan view of the integrated light-receiving device 2. The diffusion layer 3p of the PIN-PD 3 and the diffusion layer 5p of the APD 5 are disposed in a concentric circle with a common center 2z. The common center 2z of the diffusion layers 3p and 5p coincides with the optical axis of the signal light L1.

Figure 13:
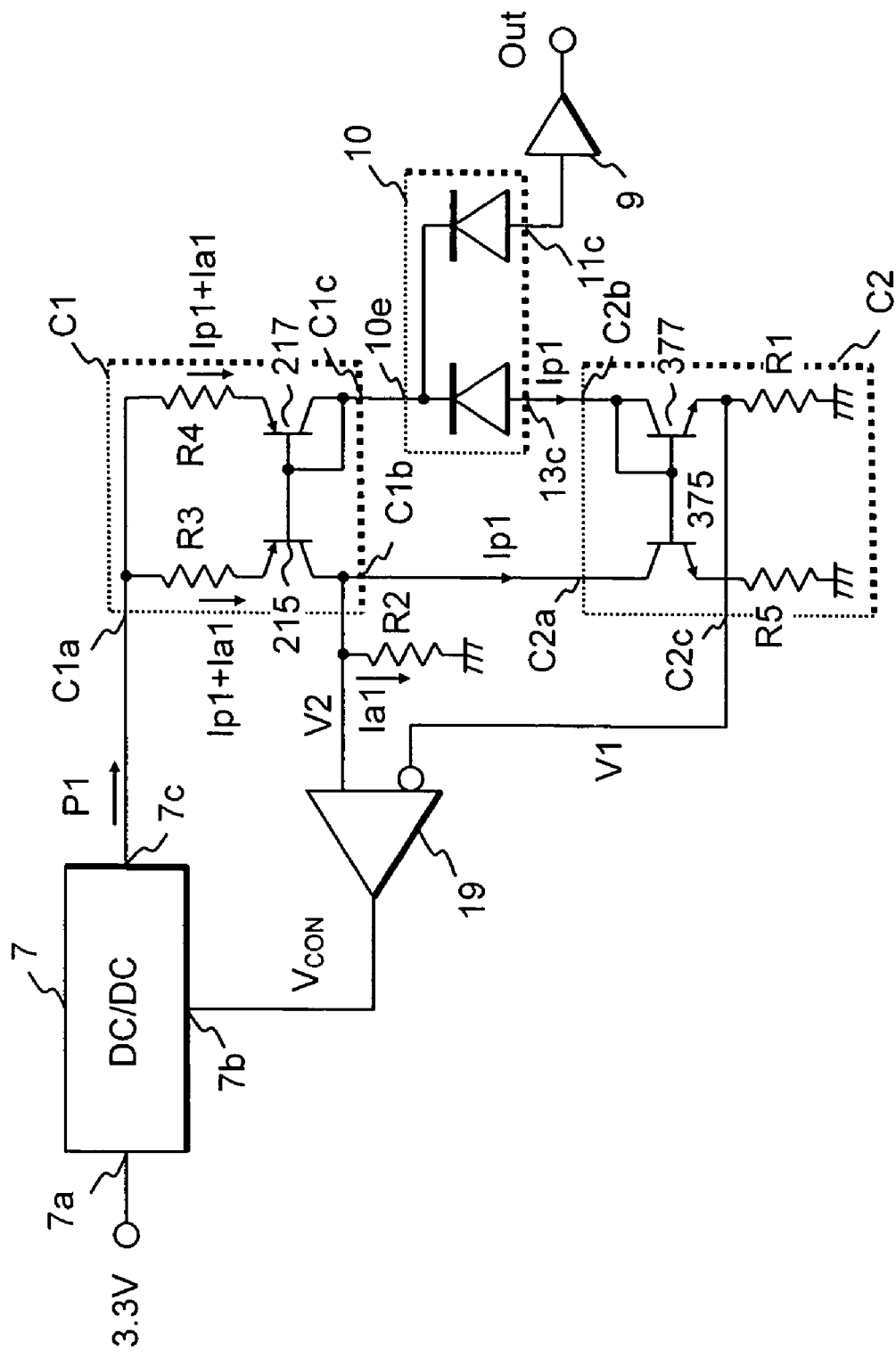
FIG. 13 is a circuit diagram of an optical receiver that uses the optical module according to the fourth embodiment.

Next, the control unit for the optical module 1c will be described. FIG. 13 is a circuit diagram of the optical receiver 31b, which includes a DC/DC-converter 7, a first current mirror circuit C1, a second current mirror circuit C2, a conversion block 17 and a comparator 19. The DC/DC-converter 7 has a first input terminal 7a to which an external power supply is connected, a second input terminal 7b that receives a control signal $V_{CONT}$ from the comparator and an output terminal 7c from which the supply voltage P2 is output to the current mirror circuit C1.

The first current mirror circuit C1 includes two transistors 215 and 217, both bases of which are connected to each other, and two resistors R3 and R4 each connected to the emitter of the corresponding transistors 215 and 217. The first current mirror circuit C1 has an input terminal C1a for receiving the voltage P2 from the DC/DC-converter 7, and two output terminals C1b and C1c each output currents having a mirror relation to each other. The second output terminal C2b is connected to the common electrode 2e of the light-receiving device 2. The second current mirror circuit C2 also includes two transistors 375 and 377, two resistors R5 and R1, two input terminals C2a and C2b, and one output terminal C2c. The first input terminal C2a is directly connected to the first output terminal C1b of the first current mirror circuit, while the second input terminal C2b is connected to the anode electrode 3c of the PIN-PD 3 to receive the photocurrent Ip generated in the PIN-PD 3. The output terminal C2c provides a voltage signal $V_1$ corresponding to the photocurrent Ip. The conversion block 17, which includes a resistor R2, is connected to the first output terminal C1b of the first current mirror circuit C1 and also to the first input terminal C2a of the second current mirror circuit C2. The conversion block converts the current Ia generated in the APD 5 into a voltage signal $V_2$. The comparator 19, whose non-inverting input receives the signal $V_2$ provided from the conversion block while its inverting input receives the signal $V_1$ provided from the output terminal C2c of the second current mirror circuit C2, generates a control signal $V_{CONT}$ to the DC/DC-converter 7.

The operation of the optical receiver 31a will be described below. When the signal light enters the integrated light-receiving device 2, a portion thereof is absorbed in the PIN-PD 3 and converted to the photocurrent Ip. Rest portion of the incident light is absorbed in the APD 5 after transmitting through the PIN-PD 3 and converted to the photocurrent Ia. Therefore, the second output terminal C1c of the first current mirror circuit C1 outputs a summed current Ip+Ia, and the first output terminal C1b thereof outputs a mirrored current Ip+Ia when the current ratio of the first current mirror circuit is unity.

Since the second input terminal C2b of the second current mirror circuit C2 is connected to the anode electrode 3c of the PIN-PD 3, the photocurrent Ip enters this terminal C2b, accordingly, the output terminal C2c provides a signal V1 converted the photocurrent Ip to the voltage signal by the relation Ip*R1. Setting the current ratio of the second current mirror circuit C2 to be unity, the first input terminal C2a thereof receives the mirrored current, Ip, with that entering the second input terminal C2b. Since this first input terminal C2a is directly connected to the first output terminal C1b of the first current mirror circuit C1 and, as explained above, the summed current Ip+Ia comes out therefrom, the difference of these current (Ip+Ia)−Ip, i.e. Ia, flows into the resistor R2, which generates the corresponding voltage signal $V_2$. The comparator 19 receives these two voltage signals $V_1$ and $V_2$, compares them, and outputs the control signal $V_{CONT}$ to the DC/DC-converter 7. This feedback loop explained above controls the voltage P1 such that two inputs of the comparator 19, i.e., $V_1$ and $V_2$ coincide to each other. Therefore, the multiplication factor m of the APD 5 is adjusted to maintain the average photocurrent Ia as follows:

$$Ia=m*Ip*(Ia2/Ip2),$$

where the currents Ia2 and Ip2 are the photocurrent of the APD 5 at the PIN-mode and that of the PIN-PD 3, respectively, under the condition that the reference light with a predetermined power enters the integrated light-receiving device 2. These two currents may be measured in advance, and the resistance of two reference resistors R1 and R2, which defines the closed loop gain of the control unit, can be decided based on the ratio of these currents.

Fifth Embodiment

Figure 14A:
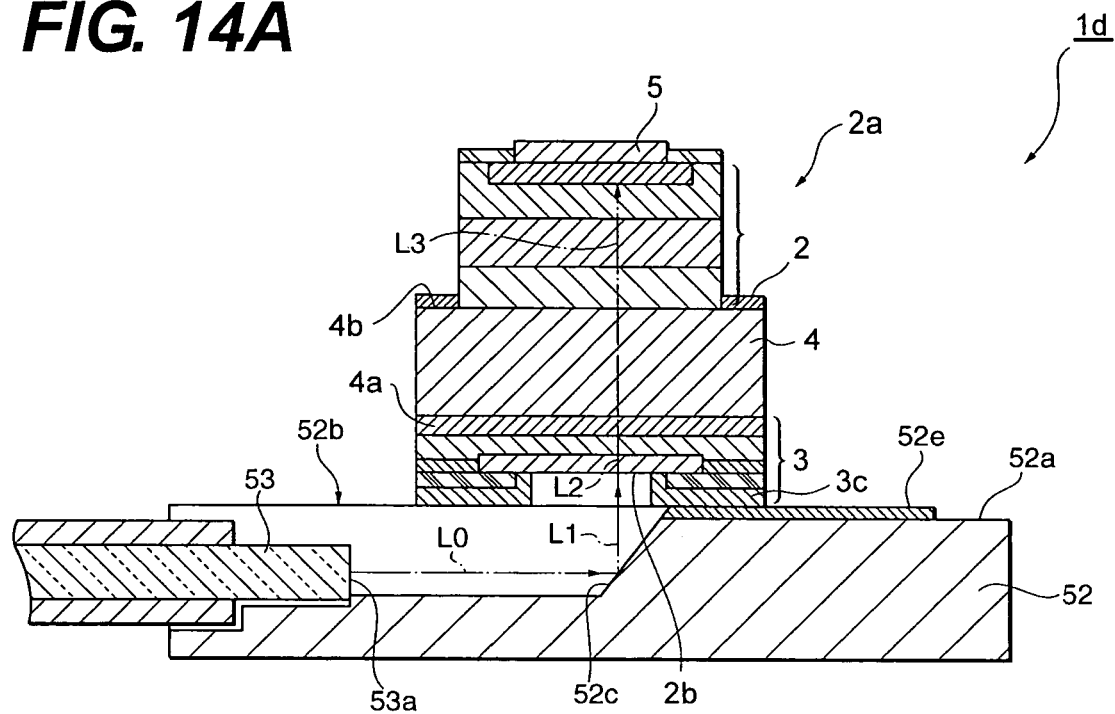
FIG. 14A is a cross sectional view of an optical module according to the fifth embodiment.
Figure 14B:
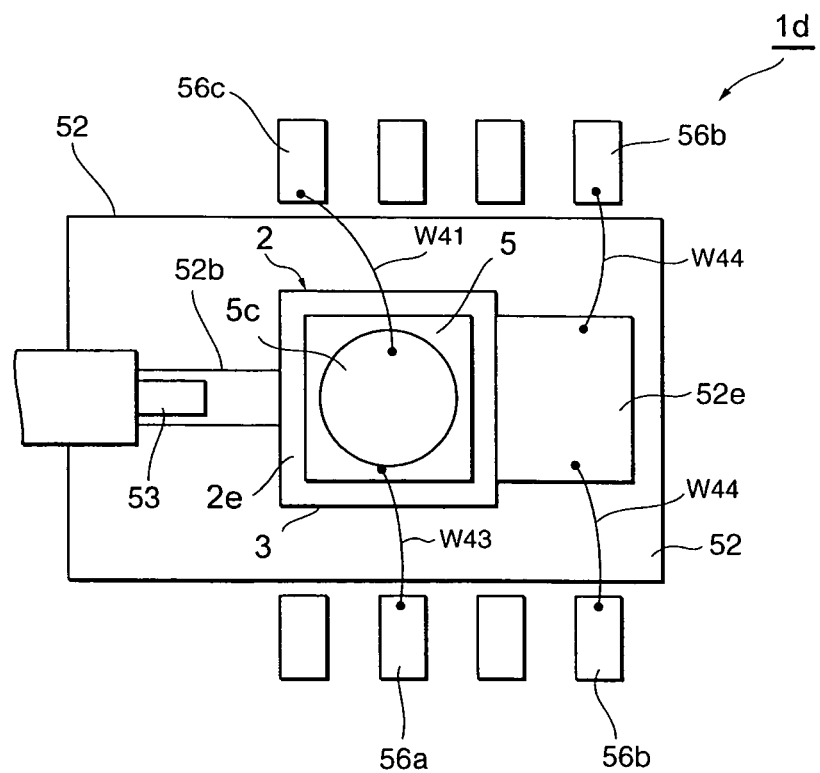
FIG. 14B is a plan view of the optical module of the fifth embodiment.

FIG. 14A is a cross section showing a modified configuration of an optical module 1d, and FIG. 14B is a plan view of the optical module 1d. The optical module 1d includes a bench 52, an optical fiber 53, and a modified integrated light-receiving device 2a.

The bench 52 has a groove 52b, within which the optical fiber 53 is disposed, on the primary surface thereof The edge of the groove 52b provides a light-reflection surface 52c, and the signal light L0 emitted from the optical fiber 53 is reflected at this light-reflecting surface 52c toward the integrated light-receiving device 2a. The light-reflecting surface 52c may be formed by coating the Au film on the surface of the groove 52b.

The integrated light-receiving device 2a is mounted on the bench 52 such that the light incident surface 2b thereof faces the light-reflecting surface 52c of the bench 52 to receive the light L1.

The PIN-PD 3 is formed on the lower surface 4a and the APD 5 is formed on the upper surface 4b of the substrate 4, respectively. The common electrode 2e is in contact with the substrate 4. That is, the edge portion of the upper surface 4b surrounding the APD 5 is exposed, and the common electrode 2e is formed in this exposed portion of the upper surface 4b. The common electrode 2e functions as the cathode electrode of the PIN-PD 3 and the cathode electrode of the APD 5.

The common electrode 2e is connected to the lead 56a with the wire W43, the anode electrode 5c of the APD 5 is connected to the lead 56c with the wire 41, and the anode electrode 3c of the PIN-PD 3 is connected to the lead 56b via the conduction pattern 52e formed on the bench 52 and the wire W44.

The optical receiver 31 may provide this optical module Id instead of the optical module 1c shown in FIG. 11. The optical receiver 31 using this optical module 1d may be resin molded since the optical module 1d uses the bench 52 and the light incident surface 2a of the integrated light-receiving device 2 faces the light-reflecting surface 52c of the bench 52, whereby the optical module Id may be miniaturized. Further, since the light-reflecting surface 52c is formed in the primary surface 52b of the bench 52, the integrated light-receiving device 2a may be positioned adjacent to the light-reflecting surface 52c and no lens to converge the light emitted from the optical fiber 53 is necessary.

Sixth Embodiment

Figure 15A:
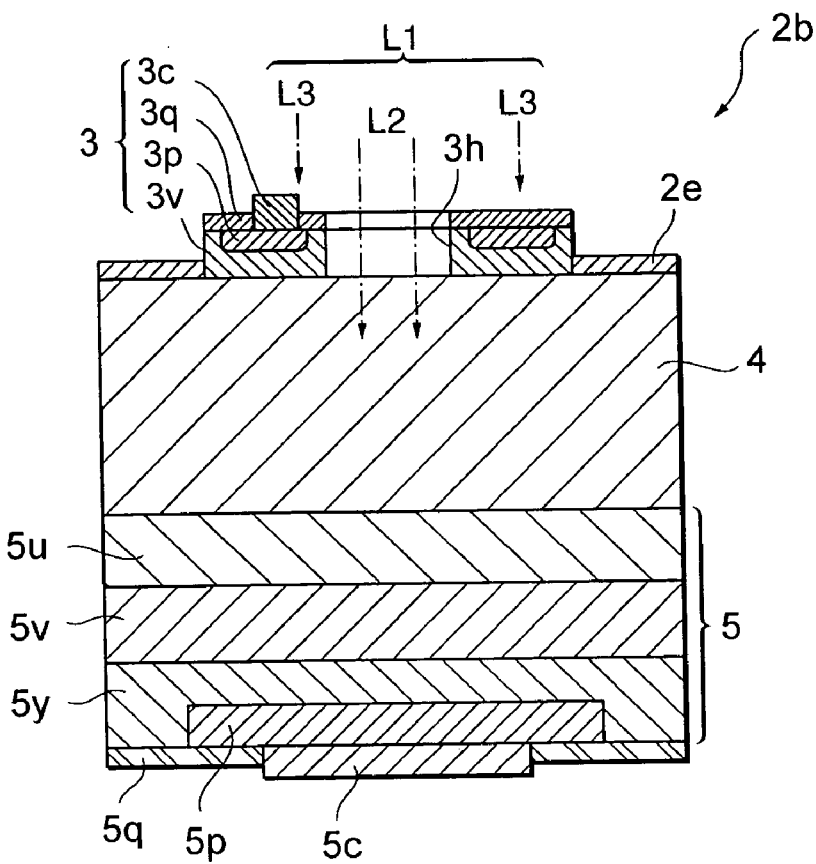
FIG. 15A is a cross sectional view showing a modified light-receiving device integrally formed with the avalanche photodiode used in the optical module of fourth and fifth embodiments.
Figure 15B:
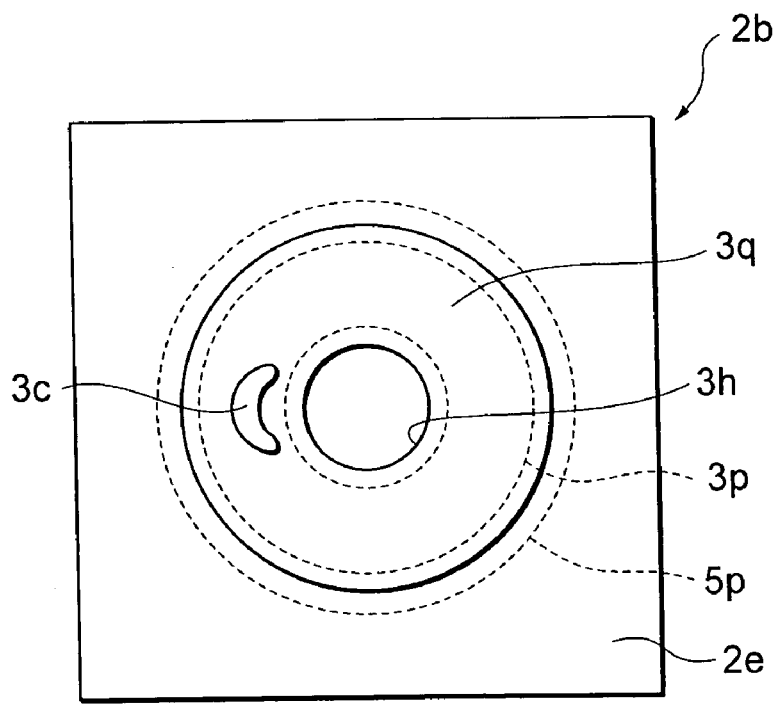
FIG. 15B is a plan view showing the modified light-receiving device.

FIG. 15A is a sectional view and FIG. 15B is a plan view showing another integrated light-receiving device 2c. The integrated light-receiving device 2c has a PIN-PD 3 with a structure different to those shown in previously described devices.

The PIN-PD 3 of the present integrated light-receiving device 2b has an opening 3h in a center thereof, as shown in FIG. 15B. The opening 3h penetrates to the substrate 4 such that the upper surface 4a of the substrate 4 exposes. Therefore, the PIN-PD 3 has a ring-shaped active layer 3v and a ring-shaped diffusion layer 3p. The anode electrode 3c of the PIN-PD 3 is formed on a portion of the diffusion layer 3p.

A portion L3 of the signal light L1 incident in the integrated light-receiving device 2c is absorbed by the PIN-PD 3, but the rest portion L2 thereof passes through the opening 3h and reaches the APD 5 transmitting through the substrate 4.

The optical receiver 1 thus described may apply the integrated light-receiving device 2c having this modified configuration. By adjusting the diameter of the opening 3h, the desired ratio of the light absorbed in the PIN-PD 3 to the transmitting light may be changed.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. An optical module for receiving an optical signal emitted from an optical fiber and outputting an output electrical signal corresponding to said optical signal, said optical module comprising:

a light-receiving device for converting a portion of said optical signal and outputting a first photocurrent corresponding to said portion of said optical signal, said light-receiving device transmitting a rest portion of said optical signal; and an avalanche photodiode for receiving said rest portion of said optical signal and outputting a second photocurrent corresponding to said rest portion of said optical signal with an optical-to-electrical conversion efficiency, wherein said electrical signal output from said optical module is kept constant in average by adjusting said optical-to-electrical conversion efficiency of said avalanche photodiode.

2. The optical module according to claim 1, further including:
a stem for mounting said avalanche photodiode thereon, and
a cover having an aperture and forming a cavity together with said stem, said avalanche photodiode being enclosed in said cavity,
wherein said rest portion of said optical signal passes through said aperture formed in said cover.

3. The optical module according to claim 2, wherein said cover has a lens for covering said aperture formed in said cover, said light-receiving device is formed on a surface of said lens such that said light-receiving device is disposed between said optical fiber and said lens.

4. The optical module according to claim 2, further including a lens formed on said light-receiving device,
wherein said light-receiving device covers said aperture formed in said cover, and said lens is disposed between said light-receiving device and said optical fiber.

5. The optical module according to claim 2, wherein said light-receiving device includes a body and a carrier for forming said body thereon and being transparent for said optical signal, said body being a thin film made of semiconductor material selected from InGaAs, InGaAsP, CdSe, PbS, PbSe, InSb, SiGe, Si and Ge.

6. The optical module according to claim 5, wherein said body has a ring shape with an opening, said rest portion of said optical signal passing through said opening.

7. The optical module according to claim 5, wherein said body has a zigzag shape.

8. The optical module according to claim 1, further including:
a stem for mounting said avalanche photodiode thereon, and
a cover having an aperture and forming a cavity together with said stem, said light-receiving device and said avalanche photodiode being enclosed in said cavity.

9. The optical module according to claim 8, wherein said light-receiving device is a PIN photodiode integrally formed with said avalanche photodiode on a same substrate having a first surface for forming said PIN photodiode and a second surface opposite to said first surface for forming said avalanche photodiode.

10. The optical module according to claim 9, further including a bench having a groove for securing said optical fiber, said groove having an end surface for reflecting said optical signal emitted from said optical fiber, said substrate being mounted on said bench such that said PIN photodiode faces said bench and said end surface of said groove,
wherein said optical signal emitted from said optical fiber is reflected by said end surface and enters said PIN photodiode.

11. The optical module according to claim 9, wherein said PIN photodiode has a ring shape with an opening in a center thereof, said rest portion of said optical signal passing through said opening and transmitting through said substrate to reach said avalanche photodiode.

12. The optical module according to claim 9, wherein said PIN photodiode has a buffer layer made of InP, an active layer made of InGaAs and having a thickness, a window layer made of InP and a diffusion layer,
wherein said thickness of said active layer is determined by a transmittance to be desired to said avalanche photodiode.

13. An optical receiver for receiving an optical signal emitted from an optical fiber and outputting an electrical signal corresponding to said optical signal, said optical receiver comprising:
an optical module including,
a light-receiving device for receiving a portion of said optical signal emitted from said optical fiber and outputting a first photocurrent corresponding to said portion of said optical signal, said light-receiving device transmitting a rest portion of said optical signal, and
an avalanche photodiode for receiving said rest portion of said optical signal and, by applying a bias voltage, outputting said a second photocurrent that corresponds to said rest portion of said optical signal with an optical-to-electrical conversion efficiency; and
a control unit for controlling said bias voltage applied to said avalanche photodiode by receiving said first photocurrent and said second photocurrent such that a ratio of said photocurrent in average to said second photocurrent in average is maintained to be a preset value.

14. The optical receiver according to claim 13, wherein said control unit further includes,
a first circuit for converting said first photocurrent to a corresponding first voltage signal;
a second circuit for converting said second photocurrent to a corresponding second voltage signal;
a comparator for comparing said first voltage signal with said second voltage signal and outputting a control signal; and
a DC/DC converter for outputting said bias voltage applied to said avalanche photodiode by receiving said control signal,
wherein said control circuit adjusts said bias voltage such that said first voltage signal is equal to said second voltage signal.

15. The optical receiver according to claim 13, wherein said first circuit includes a first reference resistor and said second circuit includes a second reference resistor,
wherein said ratio is determined by said first resistor and said second resistor.

16. The optical receiver according to claim 13, wherein said second circuit includes a first current mirror circuit having an input terminal connected to said DC/DC converter, first output terminal connected to said second reference resistor, and a second output terminal connected to said avalanche photodiode,
wherein said second photocurrent generated by said avalanche photodiode is mirrored to said first output terminal.

17. The optical receiver according to claim 13, wherein said light-receiving device is a PIN photodiode integrally formed with said avalanche photodiode on a same substrate so as to have a common cathode,
said first circuit includes a second current mirror circuit having a first input terminal connected to said second reference resistor, a second input terminal connected to an anode of said PIN photodiode, an output terminal, and said first reference resistor connected to said output terminal, said second circuit includes a first current miter circuit having an input terminal connected to said DC/DC converter, a first output terminal connected to said second reference resistor and said first input terminal of said second current mirror circuit, and a second output terminal connected to said common cathode of said light-receiving device and said avalanche photodiode, and wherein said first output terminal of said first current mirror circuit and said second output terminal of said first current mirror circuit each come out a sum of said first photocurrent and said second photocurrent, and said first input terminal of said second current mirror circuit and said second input terminal of said second current mirror circuit each come in said first photocurrent therein, and wherein said first reference resistor flows only said first photocurrent therein, and said second reference resistor flows only said second photocurrent therein.

* * * * *